US011043595B2

(12) United States Patent
Su et al.

(10) Patent No.: US 11,043,595 B2
(45) Date of Patent: Jun. 22, 2021

(54) CUT METAL GATE IN MEMORY MACRO EDGE AND MIDDLE STRAP

(71) Applicant: Taiwan Semiconductor Manufacturing Co., Ltd., Hsinchu (TW)

(72) Inventors: Hsin-Wen Su, Hsinchu (TW); Yu-Kuan Lin, Taipei (TW); Chih-Chuan Yang, Hsinchu (TW); Chang-Ta Yang, Hsinchu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 16/441,217

(22) Filed: Jun. 14, 2019

(65) Prior Publication Data
US 2020/0395476 A1 Dec. 17, 2020

(51) Int. Cl.
*H01L 29/78* (2006.01)
*H01L 21/02* (2006.01)
*H01L 21/762* (2006.01)

(52) U.S. Cl.
CPC ...... *H01L 29/785* (2013.01); *H01L 21/02381* (2013.01); *H01L 21/02532* (2013.01); *H01L 21/02576* (2013.01); *H01L 21/02579* (2013.01); *H01L 21/76224* (2013.01)

(58) Field of Classification Search
CPC combination set(s) only.
See application file for complete search history.

(56) References Cited

U.S. PATENT DOCUMENTS

| | | |
|---|---|---|
| 5,143,866 A | 9/1992 | Matsutani |
| 8,310,860 B1 | 11/2012 | Houston |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,980,763 B2 | 3/2015 | Wang et al. |
| 9,105,490 B2 | 8/2015 | Wang et al. |
| 9,236,267 B2 | 1/2016 | De et al. |

(Continued)

FOREIGN PATENT DOCUMENTS

EP  0023429 B1  12/1985

*Primary Examiner* — Ratisha Mehta
(74) *Attorney, Agent, or Firm* — Haynes and Boone, LLP

(57) ABSTRACT

A semiconductor device includes a memory macro having first and second well pick-up (WPU) areas along first and second edges of the memory macro, respectively, and memory bit areas between the first and the second WPU areas. The first and second WPU areas are oriented lengthwise generally along a first direction. In each of the first and second WPU areas, the memory macro includes n-type wells and p-type wells arranged alternately along the first direction with a well boundary between each of the n-type wells and the adjacent p-type well. The memory macro further includes active regions; an isolation structure; gate structures, and a first dielectric layer that is disposed at each of the well boundaries. From a top view, the first dielectric layer extends generally along a second direction perpendicular to the first direction and through all the gate structures in the first and the second WPU areas.

20 Claims, 11 Drawing Sheets

(56) References Cited

U.S. PATENT DOCUMENTS

| | | | |
|---|---|---|---|
| 9,236,300 B2 | 1/2016 | Liaw | |
| 9,520,482 B1 | 12/2016 | Chang et al. | |
| 9,576,814 B2 | 2/2017 | Wu et al. | |
| 9,625,824 B2 | 4/2017 | Lu et al. | |
| 9,627,379 B1 | 4/2017 | Chang et al. | |
| 10,050,045 B1 | 8/2018 | Hsu et al. | |
| 10,314,154 B1 | 6/2019 | Hsu et al. | |
| 2008/0116400 A1 | 5/2008 | Schmidt et al. | |
| 2011/0101433 A1* | 5/2011 | Kim | H01L 27/0207 257/296 |
| 2012/0261738 A1* | 10/2012 | Do | H01L 21/823814 257/315 |
| 2013/0063803 A1 | 3/2013 | Delgado et al. | |
| 2015/0235675 A1* | 8/2015 | Yu | G11C 11/412 365/51 |
| 2017/0110454 A1 | 4/2017 | Chang et al. | |
| 2017/0125411 A1 | 5/2017 | Yu et al. | |
| 2018/0151553 A1* | 5/2018 | Liaw | H01L 27/1104 |
| 2019/0067277 A1 | 2/2019 | Tsai et al. | |
| 2019/0103472 A1 | 4/2019 | Cheng et al. | |

* cited by examiner

CUT METAL GATE IN MEMORY MACRO EDGE AND MIDDLE STRAP

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices (such as static random-access memory or SRAM), leakage between adjacent n-type wells (or N wells) and p-type wells (or P wells) becomes more severe in advanced process nodes due to dopant diffusion. This leads to higher N well and P well resistance (such as in N well and P well pick-up areas and strap areas) and worse latch-up issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
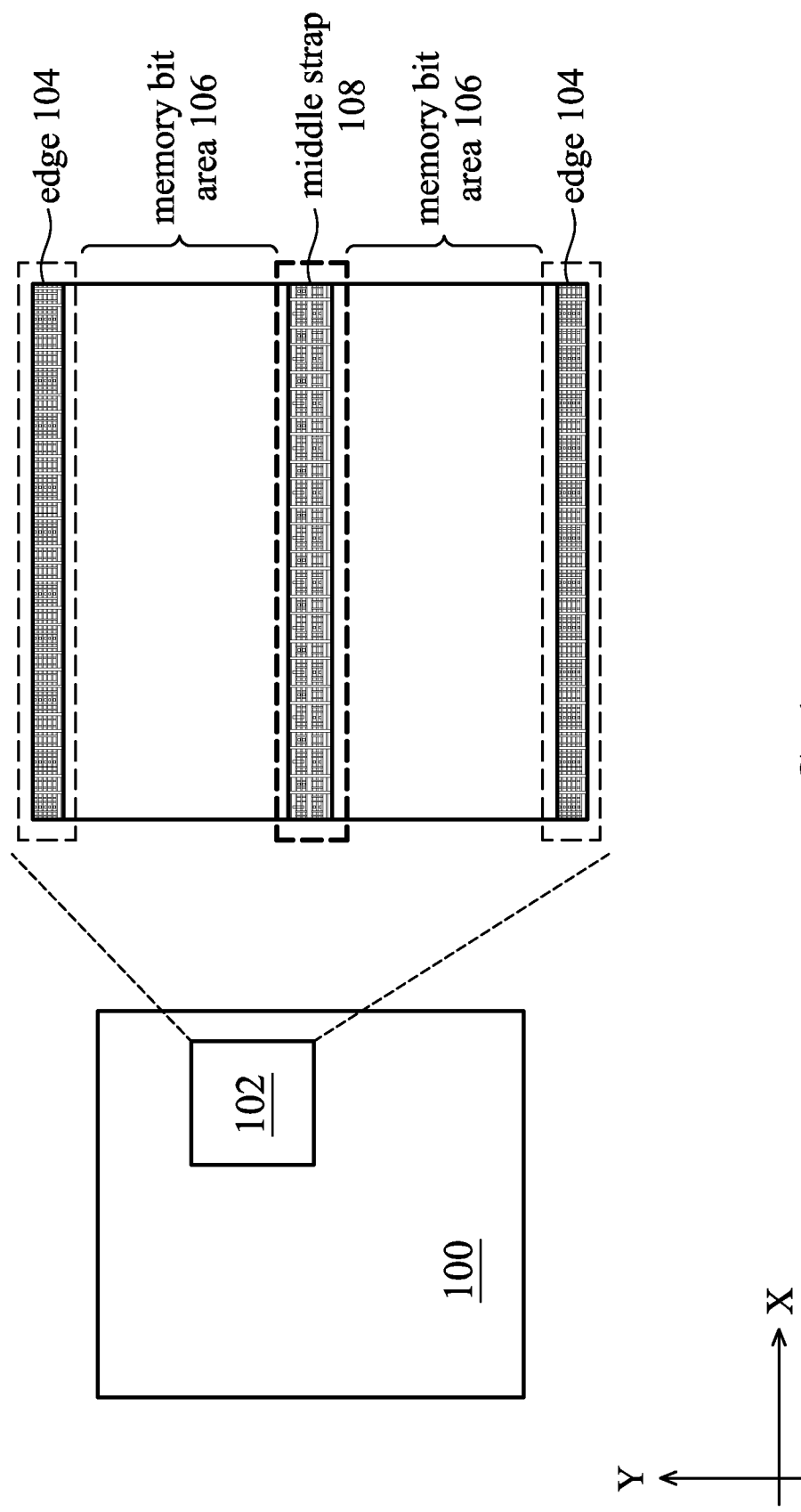
FIG. 1 is a simplified block diagram of an integrated circuit (IC) with an embedded memory, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating well isolation structures in a memory macro's well pick-up (WPU) areas (or edge areas) and middle strap areas using a cut metal gate process. The WPU areas and middle strap areas provide well pick-up structures (or tap structures), such as well tap contact plugs, in the memory macro. The well pick-up structures provide access to the P wells and N wells underlying the transistors in the memory macro. For example, tester pins may contact the well pick-up structures to provide voltages to the wells during manufacturing testing. For example, package pins or pads may be connected to the well pick-up structures in a final IC having the memory macro. The P wells and N wells (which are oppositely doped) are arranged alternately in a memory macro (i.e., every P well is next to an N well which is next to another P well) and have separate well pick-up structures.

As the devices continue to scale down, leakage current between the oppositely doped wells becomes a concern because it may trigger latch-up in the circuit. An object of the present disclosure is to solve this problem by providing well isolation features that separate adjacent oppositely doped wells, particularly in memory WPU areas and middle strap areas. Further, the well isolation features are provided as part of a cut metal gate process.

A cut metal gate process refers to a fabrication process where after a metal gate (e.g., a high-k metal gate or HK MG) replaces a dummy gate structure (e.g., a polysilicon gate), the metal gate is cut (e.g., by an etching process to form cut metal gate ("CMG") trenches) to separate the metal gate into two or more portions. Each portion functions as a metal gate for an individual transistor. An isolation material is subsequently filled into the CMG trenches. In the present disclosure, the CMG trenches are etched not only in memory bit areas but also along every well boundary in the WPU areas and middle strap areas. Accordingly, the well isolation features are formed along every well boundary in the WPU areas and middle strap areas, and greatly reduce the leakage between the oppositely doped wells in those areas.

FIG. 1 shows a semiconductor device 100 with a memory macro 102. The semiconductor device can be, e.g., a microprocessor, an application specific integrated circuit (ASIC), a field programmable gate array (FPGA), or a digital signal processor (DSP). The exact functionality of the semiconductor device 100 is not a limitation to the provided subject matter. The memory macro 102 may be a single-port SRAM macro, a dual-port SRAM macro, or other types of memory macro. The memory macro 102 includes a plurality of memory bits for storage. The semiconductor device 100 also includes peripheral logic circuits (not shown) adjacent to the memory macro 102 for implementing various functions such as write and/or read address decoder, word/bit selector, data drivers, memory self-testing, etc. Each of the memory bits and the logic circuits may be implemented with various PMOS and NMOS transistors such as planar transistors, FinFET, gate-all-around (GAA) nanosheet transistors, GAA nanowire transistors, or other types of transistors. Further, the memory macro 102 and the logic circuits may include various contact features (or contacts), vias, and metal lines for connecting the source, drain, and gate electrodes (or terminals) of the transistors to form an integrated circuit.

Still referring to FIG. 1, the memory macro 102 includes two edge areas 104. The two edge areas 104 are located at the very edge of the memory macro and are oriented lengthwise along the direction X. In the present embodiment, the two edge areas 104 do not contain memory bits and are used for implementing well pick-up structures. Therefore, they are also referred to as well pick-up (WPU) areas 104. The memory macro 102 further includes memory bit areas 106 between the two WPU areas 104. The memory bit areas 106 contain all the memory bits (implemented as transistors) of the memory macro 102. In the present embodiment, the memory macro 102 further includes a strap area 108 (or middle strap area 108) in a middle portion of the memory macro 102. As discussed above, the WPU areas 104 provide well pick-up structures for supplying voltages (or biasing) to the N wells and P wells in the memory macro 102. For a big memory macro, the voltage drop along the wells might be significant, which would result in insufficient biasing for the wells in the middle portion of the memory macro. To resolve this issue, the memory macro 102 includes a middle strap area 108. Similar to the WPU areas 104, the middle strap area 108 does not contain memory bits and is used for implementing well pick-up structures. The memory macro 102 may contain more than one middle strap area 108 in various embodiments depending on the size of the memory macro 102. For a smaller memory macro 102, the middle strap area 108 may be omitted. The details of the WPU areas 104, the memory bit areas 106, and the middle strap area 108 are further discussed with reference to FIGS. 2-5.

Figure 2:
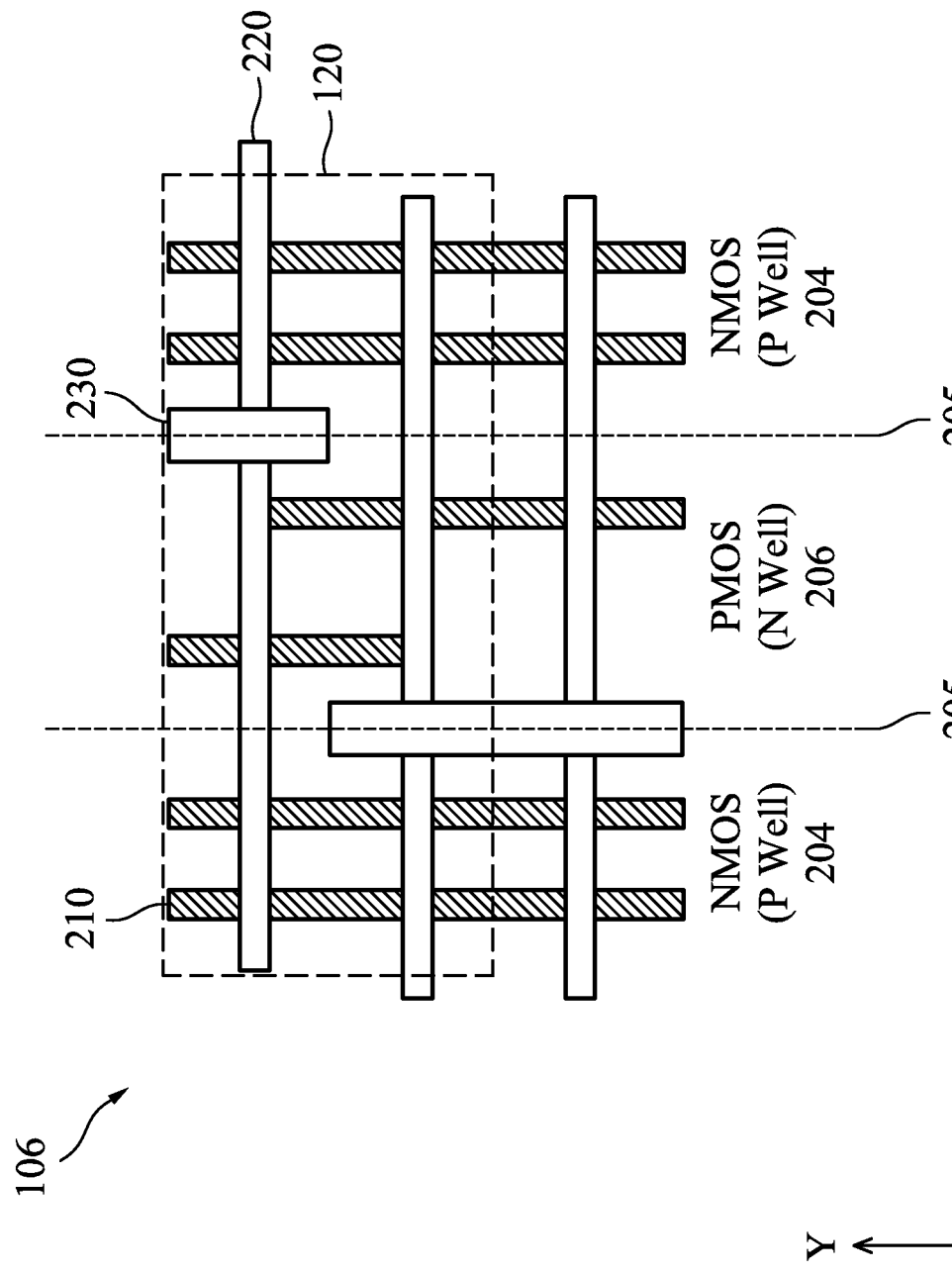
FIG. 2 shows a top view of a portion of the memory macro in FIG. 1 in a memory bit area, in accordance with an embodiment.

Referring to FIG. 2, shown therein is a top view (or a layout) of a portion of the memory bit area 106. The memory bit area 106 includes P wells 204 and N wells 206 alternately arranged along the direction X. In other words, every P well 204 is next to an N well 206 which is next to another P well 204, and this pattern repeats. The boundary between any two oppositely doped wells are indicated with dashed lines 205. Over the wells, the memory bit area 106 includes active regions 210 oriented lengthwise generally along the direction Y perpendicular to the direction X, and gate structures 220 oriented lengthwise generally along the direction X. The active regions 210 are properly doped for forming transistors. For example, the active regions 210 over the P wells 204 are doped with n-type dopants for forming NMOSFET, and the active regions 210 over the N wells 206 are doped with p-type dopants for forming PMOSFET. The active regions 210 may include fins or fin active regions for FinFETs in an embodiment or may include vertically stacked multiple nanowires or nanosheets for gate-all-around (GAA) FETs in another embodiment. The active regions 210 may take other suitable forms or shapes (such as planar active regions for planar MOSFETs). The gate structures 220 may include high-k metal gate (HK/MG) structures (i.e., having one or more metal layers over a high-k gate dielectric layer) in an embodiment, and may include other materials and/or configuration in various embodiments. The gate structures 220 engage the active regions 210 to form various transistors (not labeled), such as NMOS FinFETs, PMOS FinFETs, NMOS GAA FETs, and PMOS GAA FETs. The transistors are properly coupled to form memory bits. For example, the transistors in the dotted box 120 are coupled to form one memory bit. The memory bit area 106 further includes a dielectric layer 230 (or dielectric feature 230) that is oriented lengthwise generally along the direction Y. In the present embodiment, the dielectric layer 230 is disposed along portions of the well boundaries 205 for isolating the adjacent wells. Thus, it is also referred to as well isolation structure 230. However, it does not completely isolate the oppositely doped wells in the memory bit area 106. As shown in FIG. 2, the wells 204 and 206 still partially contact each other. The dielectric layer 230 also separates some of the gate structures 220.

Figure 3:
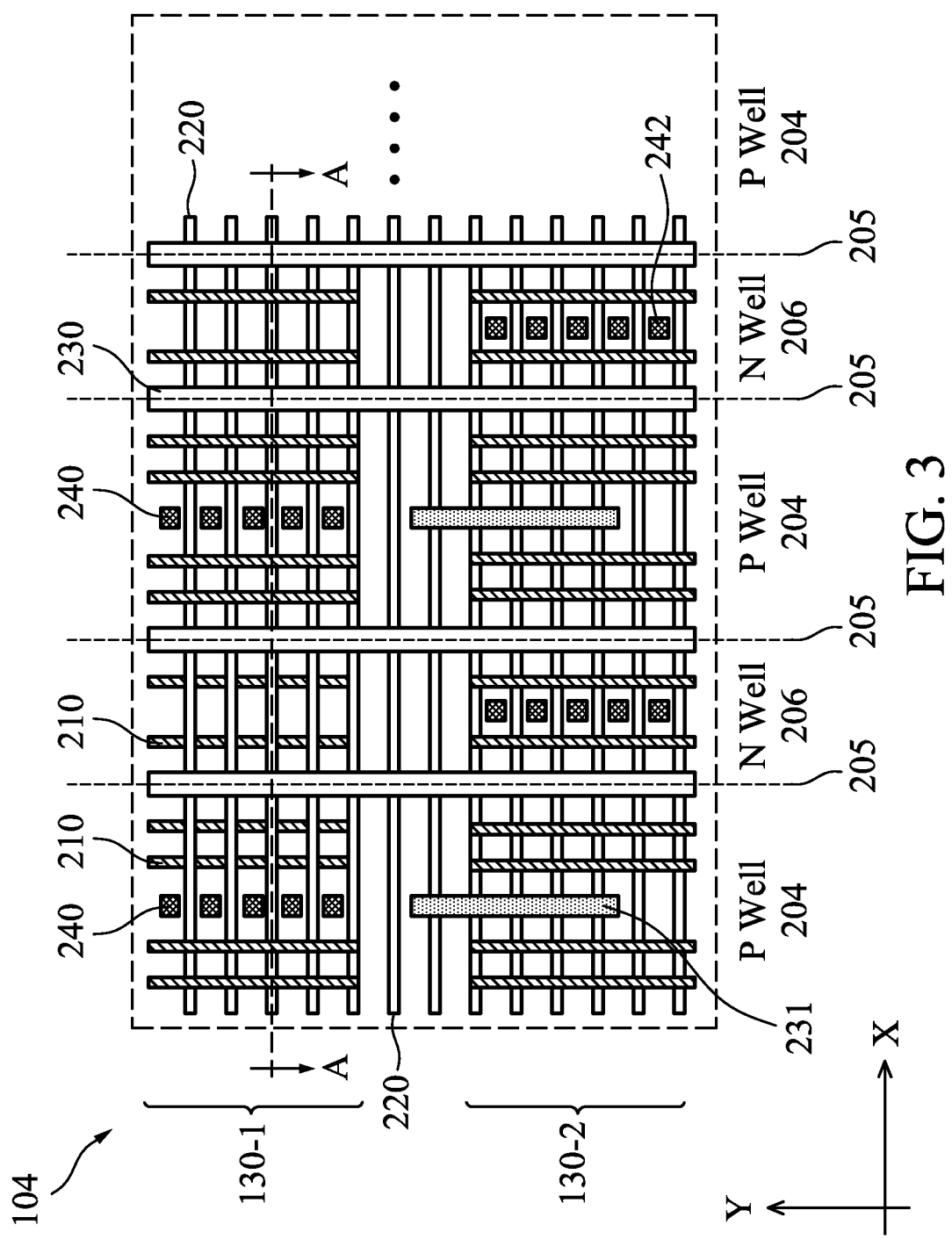
FIG. 3 shows a top view of a portion of the memory macro in FIG. 1 in a well pick-up (WPU) area, in accordance with an embodiment.

Referring to FIG. 3, shown therein is a top view (or a layout) of a portion of the WPU area 104. The WPU area 104 includes P wells 204 and N wells 206 alternately arranged along the direction X. The boundaries between the P wells 204 and the N wells 206 are indicated with dashed lines 205. In an embodiment, the P wells 204 and the N wells 206 in the WPU area 104 may extend continuously into the memory bit area 106. In other words, the P wells 204 in the WPU area(s) 104 and in the memory bit area 106 may be portions of the same P wells, and the N wells 206 in the WPU area(s) 104 and in the memory bit area 106 may be portions of the same N wells.

The WPU area 104 further includes active regions 210 over the P wells 204 and the N wells 206. The active regions 210 are oriented lengthwise generally along the direction Y. Particularly, the active regions 210 in the WPU area 104 are aligned with the active regions 210 in the memory bit area 106 along the direction Y. But they are separate from each other. The active regions 210 in the WPU area 104 are arranged in two rows, 130-1 and 132-2, along the direction X. In each row, there are at least two active regions 210 over each N well 206, and at least four active regions 210 over each P well 204. The two rows 130-1 and 130-2 are separated by at least three gate pitches along the direction Y in the present embodiment. The separation is provided for effectively isolating contact features 240 over the P wells 204 and contact features 242 over the N wells 206.

The active regions 210 in the WPU area 104 may have the same shape and configuration as the active regions 210 in the memory bit area 106. For example, the active regions 210 over the P wells 204 may be doped with n-type dopants for forming NMOSFET, and the active regions 210 over the N wells 206 may be doped with p-type dopants for forming PMOSFET. Further, the active regions 210 in the WPU area 104 may include fins or fin active regions, vertically stacked multiple nanowires or nanosheets, or planar active regions.

The WPU area 104 further includes gate structures 220 oriented lengthwise generally along the direction X. The gate structures 220 in the WPU area 104 may have the same shape and configuration as the gate structures 220 in the memory bit area 106. For example, the gate structures 220 may include high-k metal gate (HK/MG) structures in an embodiment and may include other materials and/or configuration in various embodiments.

The WPU area 104 further includes the well isolation structure 230 oriented lengthwise generally along the direction Y and disposed along each of the well boundaries 205 for isolating the adjacent wells. The well isolation structures 230 are disposed along each of the well boundaries 205 to isolate the adjacent wells. Further, the well isolation structures 230 extends fully across the WPU area 104 in the present embodiment. This effectively reduces the leakage between the oppositely doped wells 204 and 206, reduces the resistance of the well pick-up structures, and reduces the likelihood of latch up in the device 100, particularly in the WPU areas 104. The well isolation structures 230 also separate all the gate structures 220 in the WPU area 104. In some instances, up to 8 times of reduction in the resistance of the well pick-up structures has been observed, compared with designs where the well isolation structure 230 is absent or where the well isolation structure 230 separates some but not all the gate structures 220 (e.g. it separates the gate structures 220 in the row 130-1 only or those in the row 130-2 only).

Still referring to FIG. 3, in the WPU area 104, the device 100 further includes gate isolation features 231 disposed over the P wells 204 in the second row 130-2. The gate isolation features 231 are aligned with the contact features 240 along the direction Y in the present embodiment. The gate isolation features 231 are optional and may be omitted in some embodiments.

In the WPU area 104, the device 100 further includes the contact features 240 disposed over and in electrical contact with the P wells 204, and the contact features 242 disposed over and in electrical contact with the N wells 206. The contact features 240 and 242 are part of well pick-up structures, through which the wells 204 and 206 receive voltages (or biasing) from tester equipment or other circuits. In the present embodiment, the contact features 240 are disposed near the middle of each of the P wells 204 and between the active regions 210 in the first row 130-1, and the contact features 242 are disposed near the middle of each of the N wells 206 and between the active regions 210 in the second row 130-2. Accordingly, the contact features 240 and 242 are spaced out along both the direction X (by a center-to-center well pitch) and the direction Y (by at least 3 gate pitches) for effective isolation between them. Further, the number of the contact features over each well is designed to strike a balance between providing a low well pick-up resistance and costing low. The number of contact features over each of the wells affects the resistance of the well pick-up structure on the respective well. Having a greater number of contact features advantageously reduces the resistance of the well pick-up structure. However, it also takes up more chip areas, which means a higher cost. In the present embodiment, the number of the contact features 240 over each P well 204 is designed to be in a range of 2 to 10 to provide low enough resistance but also be cost effective. For the same reason, the number of the contact features 242 over each N well 206 is designed to be in a range of 2 to 10. The contact features 240 are arranged in rows along the direction X and columns along the direction Y. The number of rows ranges from 2 to 10, and the number of columns equals to the number of P wells in the WPU area 104. The contact features 242 are arranged in rows along the direction X and columns along the direction Y. The number of rows ranges from 2 to 10, and the number of columns equals to the number of N wells in the WPU area 104. Over each P well 204, the number of the contact features 240 is one less than the number of gate structures 220. Over each N well 206, the number of the contact features 242 is one less than the number of gate structures 220. The structures shown in FIG. 3 may be repeated along the direction X so that the WPU area 104 matches the memory bit area 106 for the same number of wells.

Figure 4:
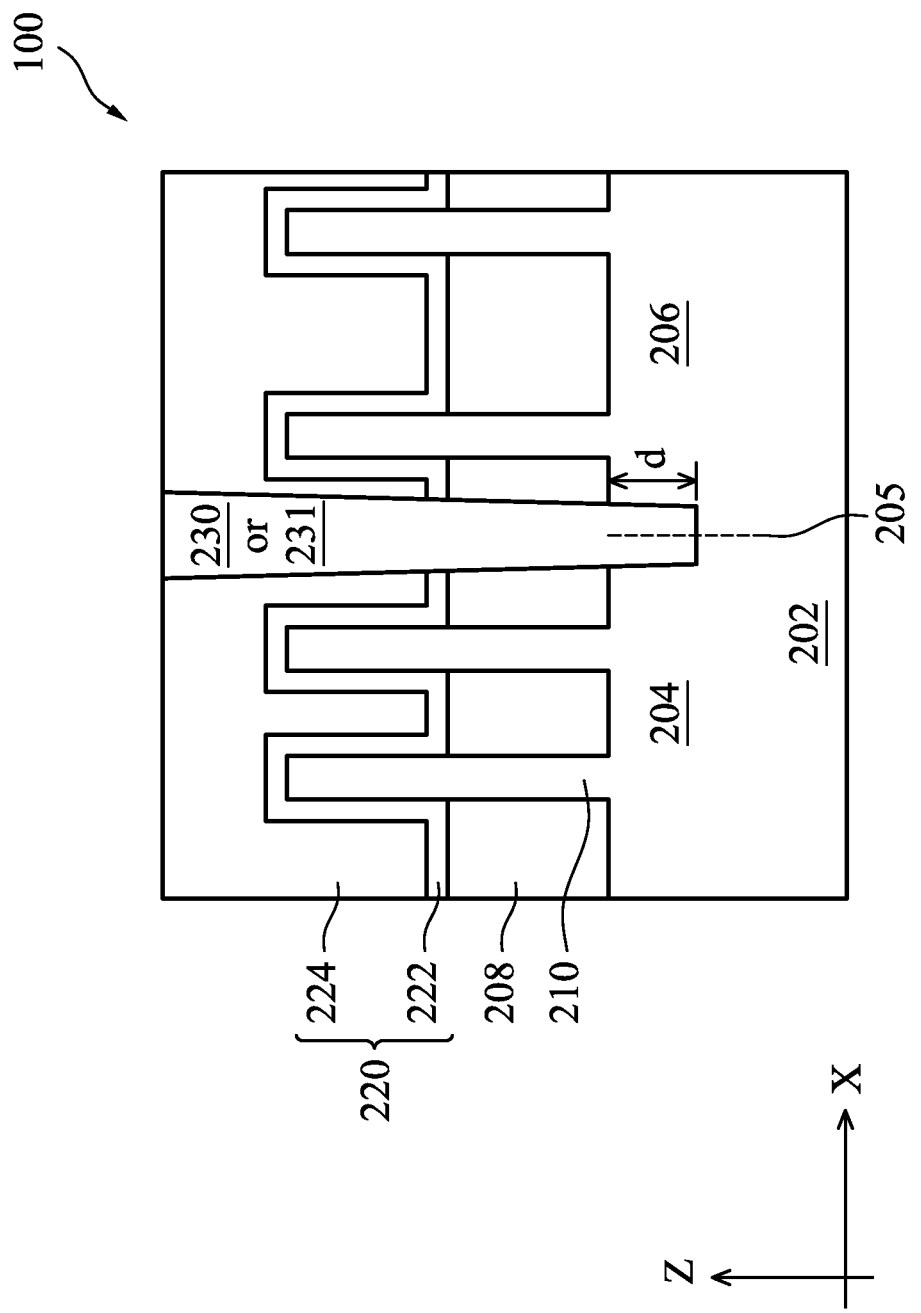
FIG. 4 shows a cross-sectional view of a portion of the memory macro in FIG. 1, in accordance with an embodiment.

FIG. 4 shows a partial, cross-sectional view of the device 100 in the WPU area 104 along the A-A line in FIG. 3. Referring to FIG. 4, the device 100 includes a substrate 202. The P wells 204 and the N wells 206 are formed in and/or on the substrate 202. The active regions 210 are formed as fins over the substrate 202 in this embodiment. The device 100 further includes an isolation structure 208 disposed over the substrate 202 and laterally between the fin active regions 210. The gate structure 220 is disposed over the isolation structure 208 and the fin active region 210. The gate structure 220 includes a gate dielectric layer 222 and a conductive layer 224. The well isolation structure 230 (as well as the optional gate isolation structure 231) penetrates through the gate structure 220 and the isolation structure 208 and extends into the wells 204 and 206. The various elements of the device 100 are further described below.

The substrate 202 is a silicon substrate in the present embodiment. Alternatively, the substrate 202 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The fin active regions 210 may comprise the same semiconductor material(s) as the substrate 202. In an embodiment, the fin active regions 210 may include alternately stacked layers of two different semiconductor materials, such as layers of silicon and silicon germanium alternately stacked. The fin active regions 210 may include n-type dopant(s) such as phosphorus or arsenic, or p-type dopant(s) such as boron or indium. The fin active regions 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin active regions 210 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO$_3$), and/or acetic acid (CH$_3$COOH); or other suitable wet etchant.

The isolation structure 208 may comprise silicon oxide, silicon nitride, silicon oxynitride, fluoride-doped silicate glass (FSG), a low-k dielectric material, and/or other suitable insulating material. The isolation structure 208 may be shallow trench isolation (STI) features. Other isolation structure such as field oxide, LOCal Oxidation of Silicon (LOCOS), and/or other suitable structures are possible. The isolation structure 208 may include a multi-layer structure, for example, having one or more thermal oxide liner layers adjacent to the fin active regions 210.

The gate dielectric layer 222 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The gate dielectric layer 222 may be formed using atomic layer deposition (ALD), chemical vapor deposition (CVD), physical vapor deposition (PVD), or other deposition techniques.

The conductive layer 224 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 224 may be formed by ALD, CVD, PVD, plating, or other techniques.

The well isolation 230 may include one or more dielectric materials, such as silicon nitride, silicon oxide, silicon oxynitride, fluoride-doped silicate glass (FSG), a low-k dielectric material, and/or other suitable insulating material. Particularly, the portion of the well isolation 230 in physical contact with the gate structure 220 includes a dielectric material that does not react with the metal materials of the gate structure 220. For example, that portion of the well isolation 230 includes silicon nitride in an embodiment. The well isolation 230 extends into the wells 204 and 206 at a depth "d" that is sufficiently deep in order to isolate the oppositely doped wells 204 and 206. For example, the well isolation 230 may extend at least 25 nm (i.e., d is at least 25 nm) below the top surface of the substrate 202, such as between about 25 nm and about 75 nm below the top surface of the substrate 202. Because the dopants in the wells 204 and 206 tend to concentrate at or above such depth, the well isolation structure 230 effectively blocks the leakage path between the adjacent wells by extending such depth into the wells 204 and 206 at the well boundary 205.

Figure 5:
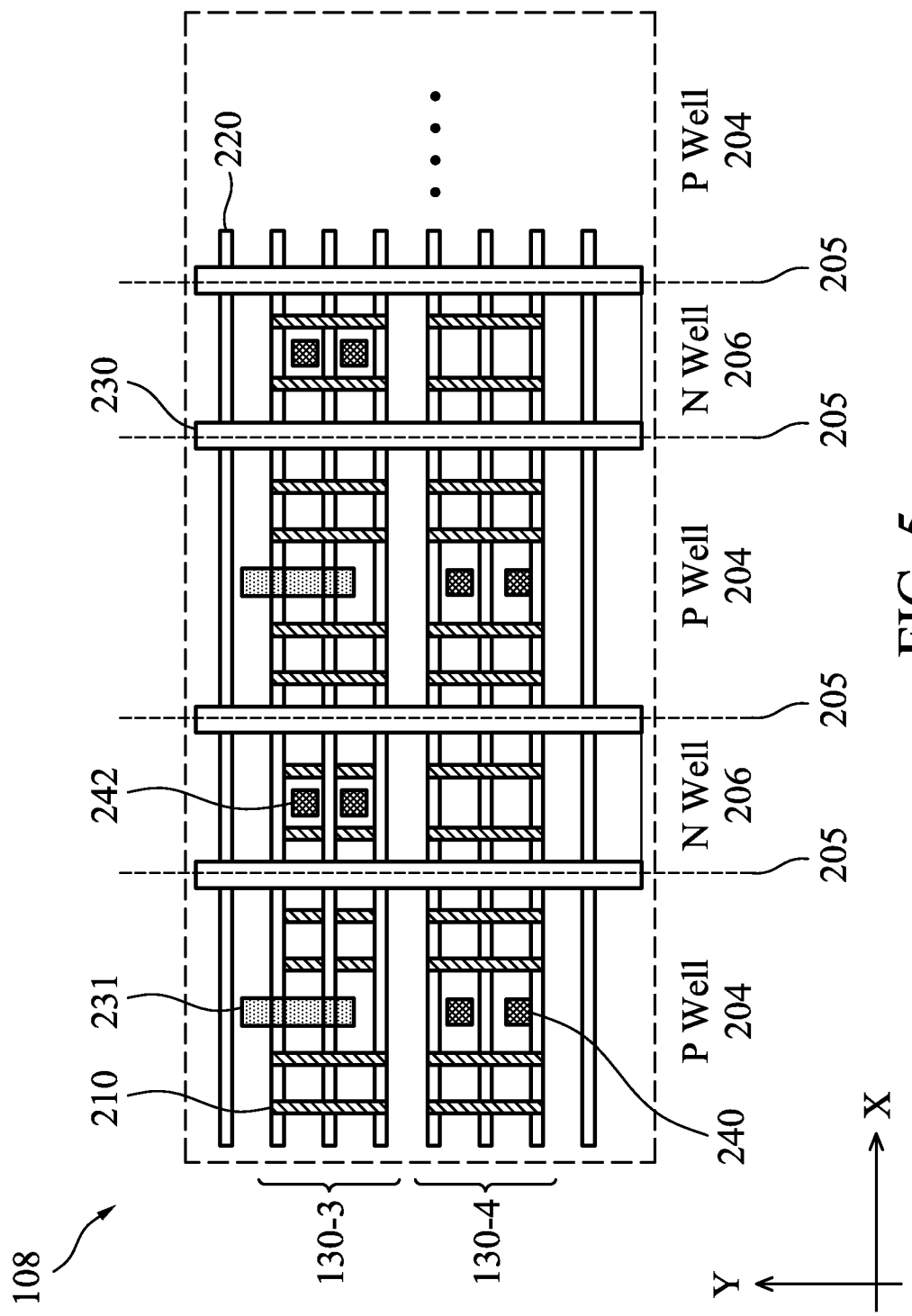
FIG. 5 shows a top view of a portion of the memory macro in FIG. 1 in a middle strap area, in accordance with an embodiment.

Referring to FIG. 5, shown therein is a top view (or a layout) of the middle strap area 108. The middle strap area 108 has a similar structure as the WPU area 104. Thus, it is briefly described below. The middle strap area 108 includes P wells 204 and N wells 206 alternately arranged along the direction X. The boundaries between the P wells 204 and the N wells 206 are indicated with dashed lines 205. In an embodiment, the P wells 204 and the N wells 206 in the middle strap area 108 may extend continuously into the memory bit area 106. The middle strap area 108 further includes active regions 210 over the P wells 204 and the N wells 206. The active regions 210 are oriented lengthwise generally along the direction Y. Particularly, the active regions 210 in the middle strap area 108 are aligned with the active regions 210 in the memory bit area 106 along the direction Y. The active regions 210 in the middle strap area 108 are arranged in two rows, 130-3 and 132-4, along the direction X. The middle strap area 108 further includes gate structures 220 oriented lengthwise generally along the direction X. In the middle strap area 108, the device 100 further includes contact features 240 disposed over and in electrical contact with the P wells 204, and contact features 242 disposed over and in electrical contact with the N wells 206. The contact features 240 and 242 are part of well pick-up structures. In the present embodiment, the contact features 240 are disposed near the middle of each of the P wells 204 and between the active regions 210 in the row 130-4; and the contact features 242 are disposed near the middle of each of the N wells 206 and between the active regions 210 in the row 130-3. In the present embodiment, the number of the contact features 240 over each P well 204 is designed to be in a range of 2 to 10, and the number of the contact features 242 over each N well 206 is designed to be in a range of 2 to 10. The middle strap area 108 includes well isolation structures 230 disposed along each of the well boundaries 205 to isolate the adjacent wells. Further, the well isolation structures 230 extends fully across the middle strap area 108 in the present embodiment. The well isolation structures 230 also separate all the gate structures 220 in the middle strap area 108. The device 100 further includes optional gate isolation features 231 disposed over the P wells 204 in the row 130-3.

Figure 6:
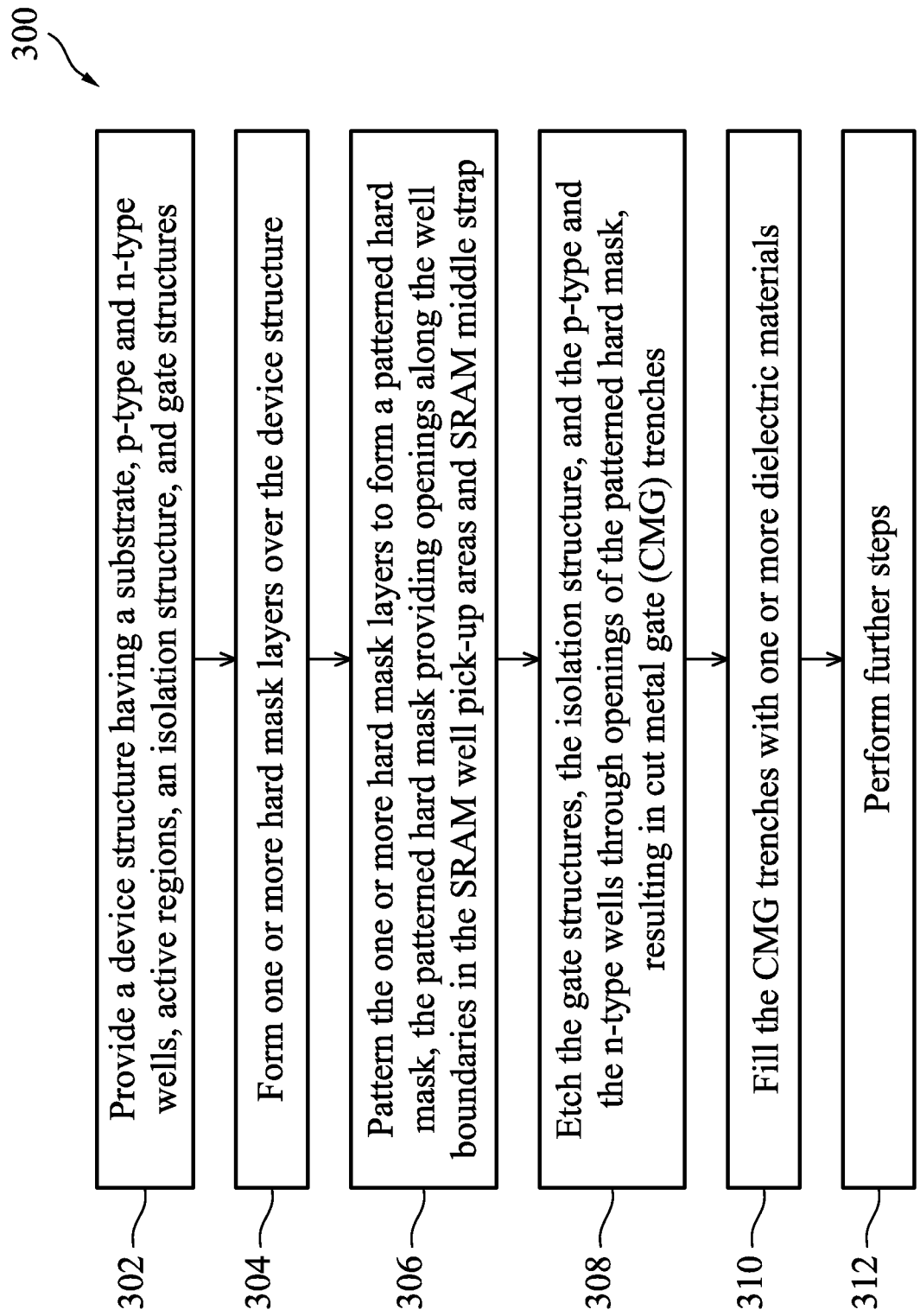
FIG. 6 shows a flow chart of a method for forming the structure shown in FIGS. 1-5, according to aspects of the present disclosure.

FIG. 6 illustrate a flow chart of a method 300 for forming the semiconductor device 100 in accordance with an embodiment. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 7-11, which illustrate various cross-sectional views (e.g., along the A-A line in FIG. 3) of the semiconductor device 100 during fabrication steps according to the method 300.

Figure 7:
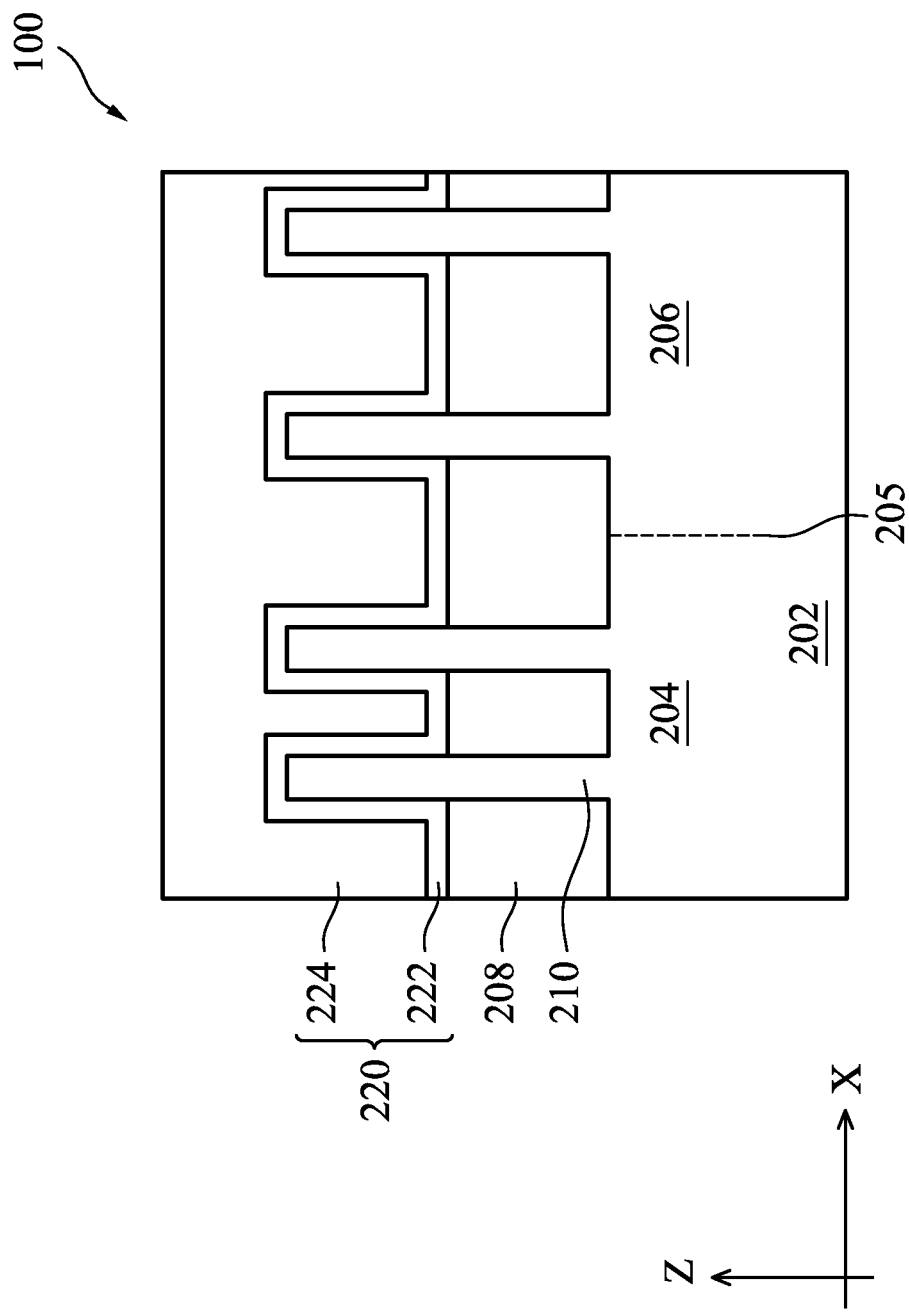
FIGS. 7, 8, 9, 10, and 11 illustrate cross-sectional views of a semiconductor structure during a fabrication process according to the method of FIG. 6, in accordance with an embodiment.

At operation 302, the method 300 (FIG. 6) provides, or is provided with, a device structure 100 having a substrate 202, P wells 204 and N wells 206 in or on the substrate 202, active regions 210 over the wells 204 and 206, an isolation structure 208 over the substrate 202 and between the active regions 210, and a gate structure 220 having a gate dielectric layer 222 and a conductive layer 224, such as shown in FIG. 7. The materials for the above elements have been discussed above with reference to FIG. 4. Particularly, the above elements are provided in a WPU area 104 and/or a middle strap area 108 of a memory macro (e.g., memory macro 102) of the device 100. The device 100 may include other elements such as source/drain features and an interlayer dielectric (ILD) layer.

Figure 8:
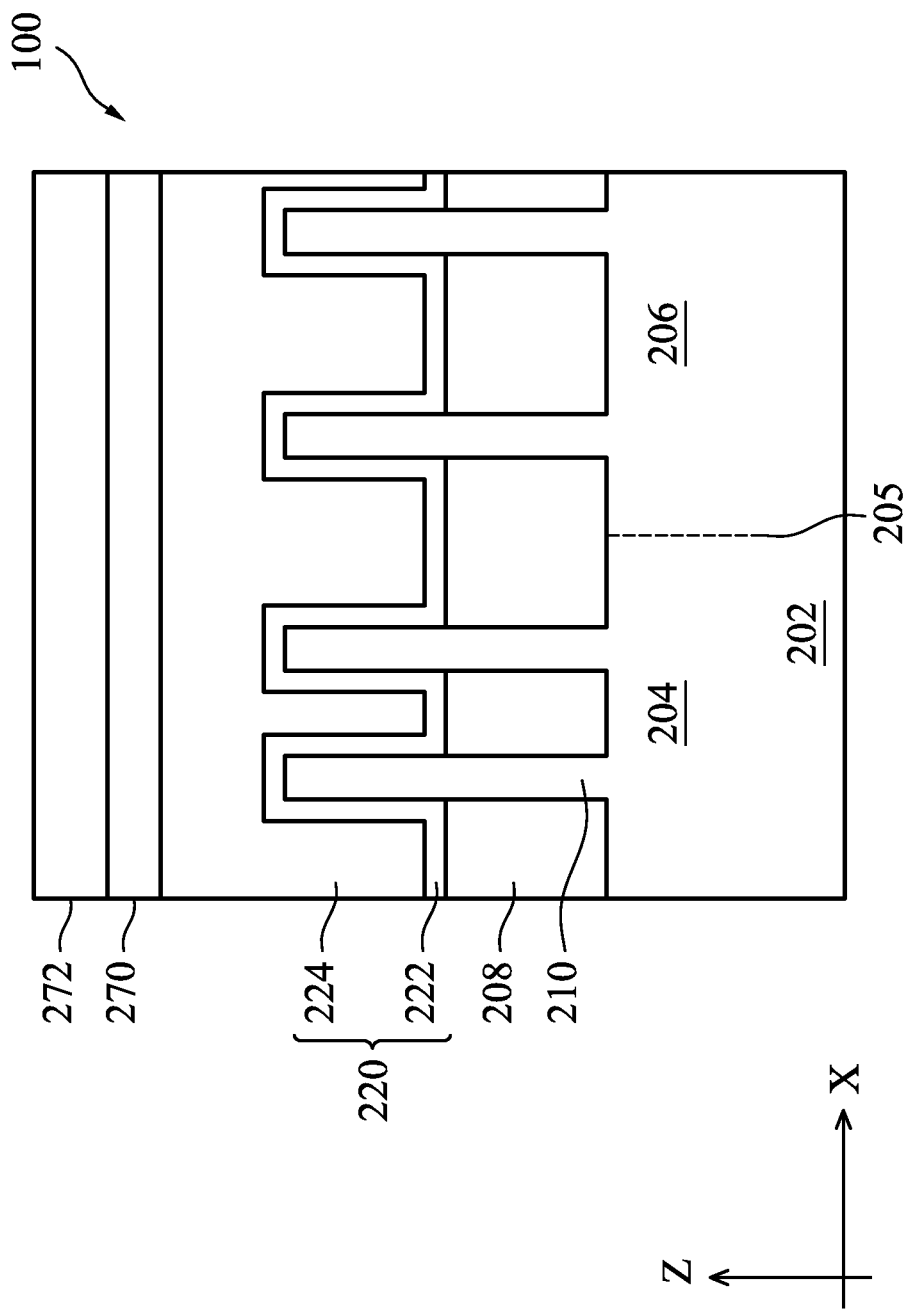

At operation 304, the method 300 (FIG. 6) forms one or more hard mask layers over the device 100, such as shown in FIG. 8. Two hard mask layers 270 and 272 are illustrated in this example. The hard mask layer 270 may include titanium nitride, while the hard mask layer 272 may include silicon nitride. The hard mask layers 270 and 272 may use other materials in alternative embodiments. The hard mask layers 270 and 272 may be deposited using CVD, PVD, ALD, or other suitable methods.

Figure 9:
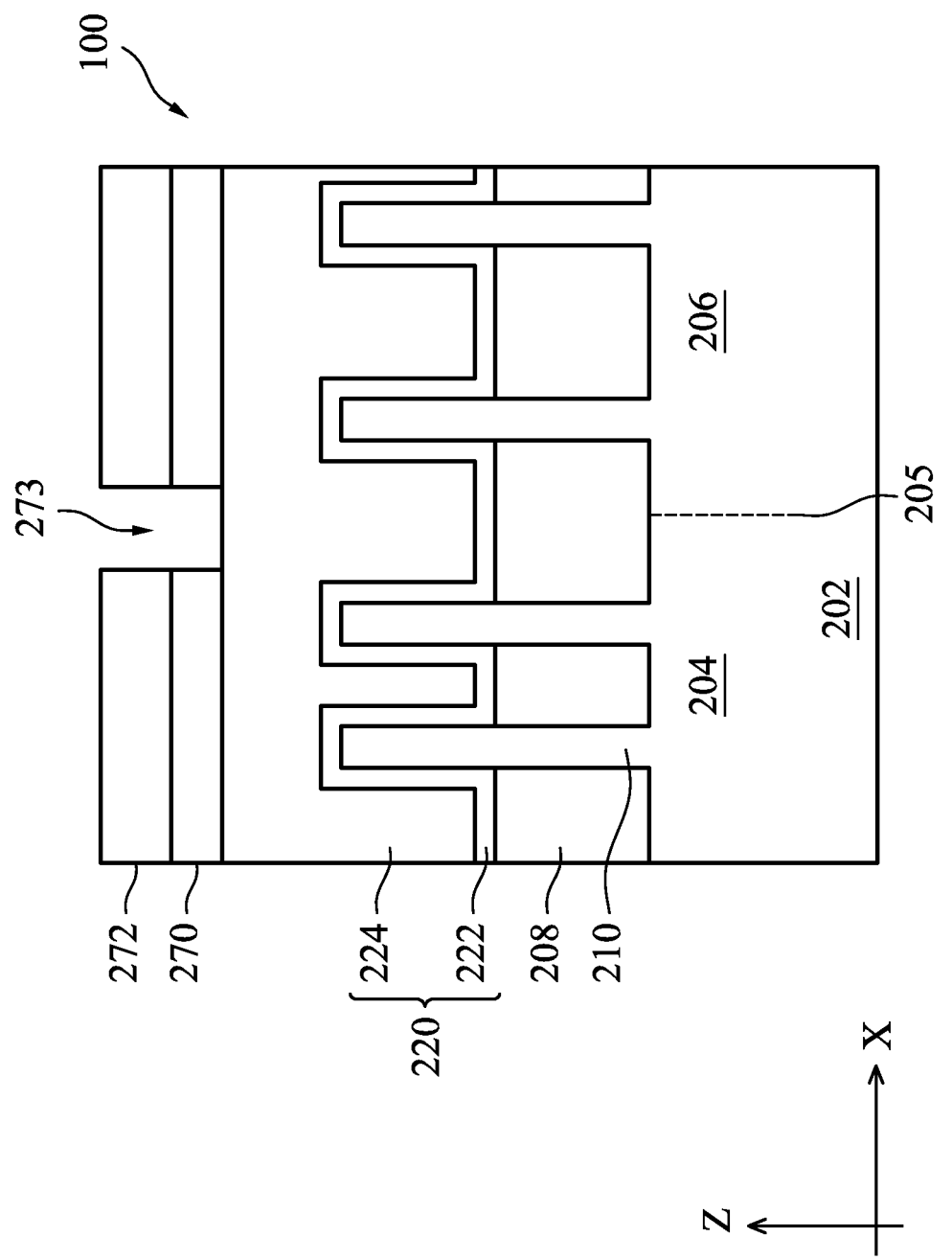

At operation 306, the method 300 (FIG. 6) patterns the one or more hard mask layers to form a pattern hard mask, such as shown in FIG. 9. Referring to FIG. 9, the hard mask layers 270 and 272 are patterned (e.g., etched) to provide an opening 273 that exposes the conductive layer 224. In an example, the operation 306 may form a patterned photoresist over the hard mask layers 270 and 272 by photoresist coating, exposing, post-exposure baking, and developing. The patterned photoresist corresponds to the patterns of the well isolation structure 230 and the optional gate isolation structure 231 in FIGS. 2, 3, and 5. Then, the operation 306 etches the hard mask layers 270 and 272 using the patterned photoresist as an etch mask to form the opening 273. The etching process may include wet etching, dry etching, reactive ion etching, or other suitable etching methods. The patterned photoresist is removed thereafter, for example, by resist stripping.

Figure 10:
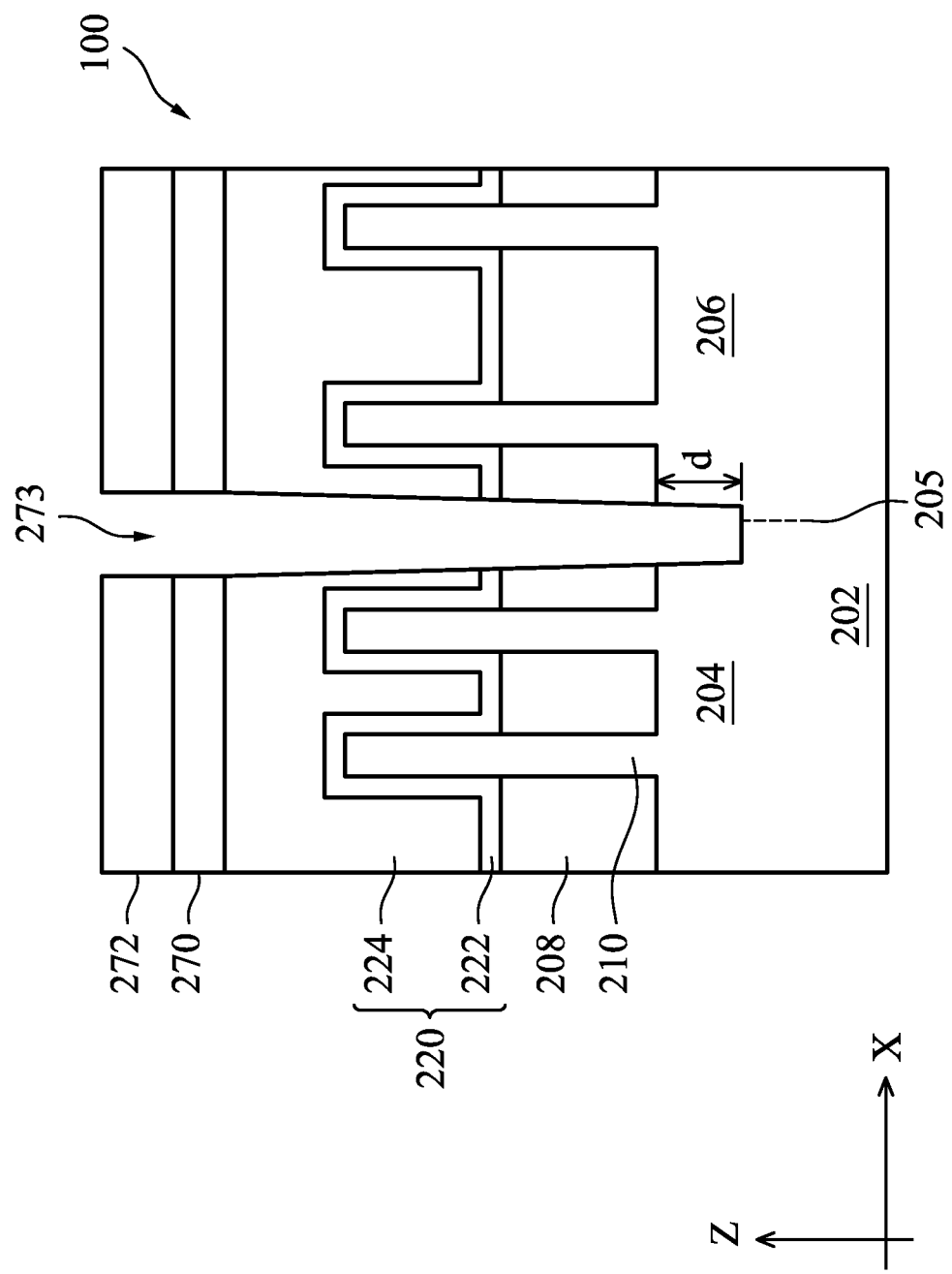

At operation 308, the method 300 (FIG. 6) etches the gate structure 220, the isolation structure 208, and the wells 204 and 206 through the opening 273. The patterned hard mask layers 270 and 272 protect the rest of the device 100 from the etching process. Referring to FIG. 10, the operation 308 extends the opening 273 through the gate structure 220 and the isolation structure 208, and into the wells 204 and 206 by a depth "d." At this stage, the opening 273 becomes a cut metal gate (CMG) trench. The depth "d" of the CMG trench 273 into the wells 204 and 206 is sufficiently deep to isolate the oppositely doped wells 204 and 206, as discussed with reference to FIG. 4. The etching process may use one or more etchants or a mixture of etchants that etch the various layers in the gate structure 220, the isolation structure 208, and the wells 204 and 206. For example, the operation 308 may apply an etchant that includes chlorine, fluorine, bromine, oxygen, hydrogen, carbon, or a combination thereof.

Figure 11:
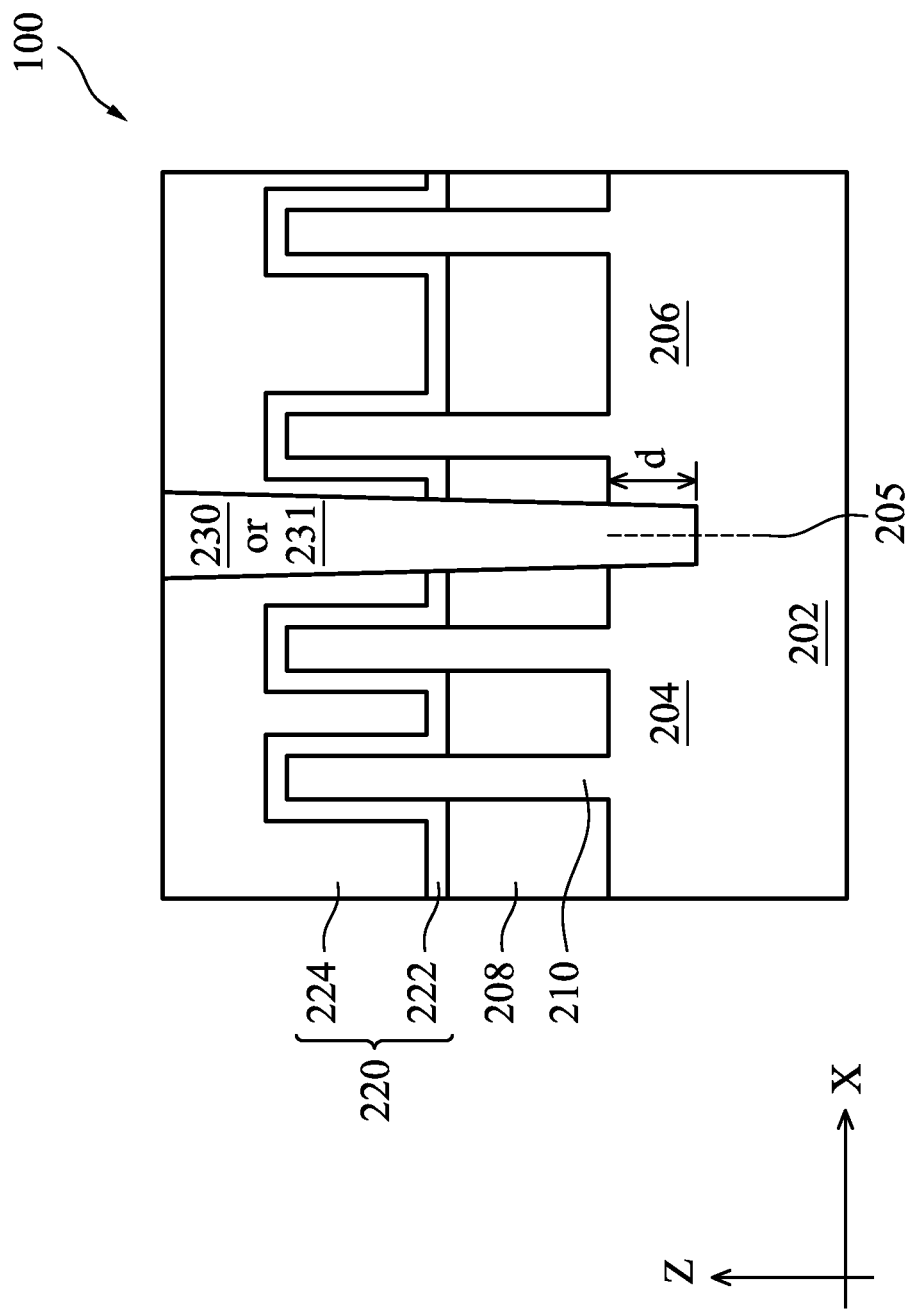

At operation 310, the method 300 (FIG. 6) fills the CMG trench 273 with one or more dielectric materials to form the well isolation structure 230 and the optional gate isolation structure 231. The well isolation structure 230 (or the optional gate isolation structure 231) may include silicon nitride in its outer portion and silicon oxide in its inner portion. Alternatively, the well isolation structure 230 (or the optional gate isolation structure 231) may include one uniform layer of silicon nitride and is free of oxide. the well isolation structure 230 and the optional gate isolation structure 231 may be deposited using CVD, PVD, ALD, or other suitable methods. Subsequently, the operation 310 performs one or more chemical mechanical planarization (CMP) processes to remove the hard mask layers 272 and 270 and any excessive dielectric material. The resultant structure is shown in FIG. 11. In some embodiment, the operation 310 may also recess the gate structures 220 to a desired HK MG height. In the present embodiment, the operations 304, 306, 308, and 310 are performed simultaneously in the memory macro's WPU area(s), middle strap area(s), and memory bit area(s). In the memory bit areas, the well isolation structures 230 not only isolate the adjacent oppositely doped wells but also separate the gate structures 220 into individual functional units. In the WPU areas and middle strap area, the well isolation structures 230 isolate the adjacent oppositely doped wells and reduce well pick-up resistance.

At operation 312, the method 300 (FIG. 6) performs further steps to complete the fabrication of the device 100. For example, the method 300 may form contacts and vias electrically connecting the S/D features and the gate structures and form metal interconnects connecting various transistors from the memory macro 102 as well as other parts of the IC 100.

Although not intended to be limiting, one or more embodiments of the present disclosure provide many benefits to a semiconductor device and the formation thereof. For example, embodiments of the present disclosure provide well isolation structures along every well boundary in well pick-up (WPU) areas and middle strap areas of a memory macro. The well isolation structures effectively isolate the adjacent oppositely doped wells and reduce well pick-up resistance. Further, the well isolation structures are formed by a cut metal gate process that is performed to the well pick-up (WPU) areas, the middle strap area, and the memory bit areas at the same time. Thus, embodiments of the present disclosure can be readily integrated into existing semiconductor manufacturing processes.

In one exemplary aspect, the present disclosure is directed to a semiconductor device. The semiconductor device includes a memory macro. The memory macro includes a first well pick-up (WPU) area along a first edge of the memory macro, a second WPU area along a second edge of the memory macro, and memory bit areas arranged between the first and the second WPU areas. The first and the second WPU areas are oriented lengthwise generally along a first direction. In each of the first and the second WPU areas, the memory macro includes n-type wells and p-type wells arranged alternately along the first direction with a well boundary between each of the n-type wells and the adjacent p-type well; active regions over the n-type and the p-type wells and oriented lengthwise generally along a second direction perpendicular to the first direction; an isolation structure over the n-type and the p-type wells and laterally between the active regions; gate structures over the isolation structure and the active regions and oriented lengthwise generally along the first direction; and a first dielectric layer disposed at each of the well boundaries. From a cross-sectional view, the first dielectric layer extends vertically through the gate structures and the isolation structure and into the n-type and the p-type wells. From a top view, the first dielectric layer extends generally along the second direction and through all of the gate structures in the first and the second WPU areas.

In an embodiment of the semiconductor device, the active regions in the first WPU area are arranged in a first row and a second row along the first direction, the active regions in the first row are aligned with the active regions in the second row, and two or more of the gate structures are arranged between the first and the second rows. In a further embodiment, in the first WPU area, the memory macro further includes first contact features disposed over each of the p-type wells and between the active regions in the first row and second contact features disposed over each of the n-type wells and between the active regions in the second row. In a further embodiment, the number of the first contact features disposed over each of the p-type wells is in a range from 2 to 10, and the number of the second contact features disposed over each of the n-type wells is in a range from 2 to 10.

In an embodiment of the semiconductor device, the first dielectric layer includes a nitride. In another embodiment, the memory macro further includes a strap area, wherein the memory bit areas are arranged between the strap area and each of the first and the second WPU areas, wherein the n-type and the p-type wells also extend across the strap area, and the first dielectric layer is also disposed at each of the well boundaries in the strap area and extends across the strap area. In a further embodiment, in the strap area, the memory macro includes at least two rows of first contact features disposed over the p-type wells and at least two rows of second contact features disposed over the n-type wells, and wherein the first and the second contact features are disposed on different rows.

In an embodiment of the semiconductor device, the memory macro includes at least two active regions over each of the n-type wells and at least four active regions over each of the p-type wells. In another embodiment, the active regions include fin active regions and the gate structures include high-k metal gates. In yet another embodiment, the first dielectric layer extends fully across the first and the second WPU areas.

In another exemplary aspect, the present disclosure is directed to a semiconductor device comprising a memory macro. The memory macro includes a first well pick-up (WPU) area along a first edge of the memory macro; a second WPU area along a second edge of the memory macro opposite the first edge; a strap area in a middle portion of the memory macro; and memory bit areas arranged between the strap area and each of the first and the second WPU areas. The first and the second WPU areas and the strap area are oriented lengthwise generally along a first direction. In the first WPU area, the memory macro includes n-type wells and p-type wells arranged alternately one after another along the first direction with a well boundary between each pair of adjacent n-type well and p-type well; active regions over the n-type and the p-type wells and oriented lengthwise generally along a second direction perpendicular to the first direction; an isolation structure over the n-type and the p-type wells and laterally between the active regions; gate structures over the isolation structure and the active regions and oriented lengthwise generally along the first direction; and a first dielectric layer. From a cross-sectional view, the first dielectric layer extends vertically through the gate structures and the isolation structure and into the n-type and the p-type wells. From a top view, the first dielectric layer extends generally along each of the well boundaries and fully across the first WPU area.

In an embodiment of the semiconductor device, the n-type and the p-type wells also extend into the second WPU area, and the first dielectric layer is also disposed at each of the well boundaries in the second WPU area and extends fully across the second WPU area. In another embodiment, the n-type and the p-type wells also extend into the strap area, and the first dielectric layer is also disposed at each of the well boundaries in the strap area and extends fully across the strap area. In yet another embodiment, the n-type and the p-type wells also extend into the memory bit areas, and a portion of the first dielectric layer is disposed along a well boundary in the memory bit areas.

In another embodiment of the semiconductor device, in the first WPU area, the memory macro further includes first contact features disposed over the p-type wells; and second contact features disposed over the n-type wells, wherein the first and the second contact features are disposed on different rows along the first direction. In a further embodiment, the number of the first contact features over each of the p-type wells is in a range from 2 to 10, and the number of the second contact features over each of the n-type wells is in a range from 2 to 10.

In yet another exemplary aspect, the present disclosure is directed to a layout of a memory macro. The layout includes a first well pick-up (WPU) area, a second WPU area, and memory bit areas arranged between the first and the second WPU areas. The first and the second WPU areas are oriented lengthwise generally along a first direction. In the first WPU area, the layout includes n-type wells and p-type wells arranged alternately one after another along the first direction with a well boundary between each pair of adjacent n-type well and p-type well; active regions over the n-type and the p-type wells and oriented lengthwise generally along a second direction perpendicular to the first direction; gate structures over the active regions and oriented lengthwise generally along the first direction; and first dielectric features extending generally along the second direction and along each of the well boundaries and fully across the first WPU area, the first dielectric features separating the gate structures.

In an embodiment, in the first WPU area, the layout further includes at least two rows of first contact features disposed over the p-type wells and at least two rows of second contact features disposed over the n-type wells, wherein the first and the second contact features are disposed on different rows along the first direction.

In another embodiment, the layout further includes a strap area in a middle portion of the memory macro. The memory bit areas are arranged between the strap area and each of the first and the second WPU areas. The n-type and the p-type wells and the well boundaries also extend across the strap area. In the strap area, the layout further includes second active regions over the n-type and the p-type wells and oriented lengthwise generally along the second direction; second gate structures over the second active regions and oriented lengthwise generally along the first direction; and second dielectric features extending generally along the second direction and along each of the well boundaries and fully across the strap area, the second dielectric features separating the second gate structures.

In a further embodiment, in the strap area, the layout further includes at least two rows of first contact features disposed over the p-type wells and at least two rows of second contact features disposed over the n-type wells, wherein the first and the second contact features are disposed on different rows along the first direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a memory macro, wherein the memory macro includes:
      a first well pick-up (WPU) area along a first edge of the memory macro;
      a second WPU area along a second edge of the memory macro, the first and the second WPU areas being oriented lengthwise generally along a first direction; and
      memory bit areas arranged between the first and the second WPU areas, wherein, in each of the first and the second WPU areas, the memory macro includes:

n-type wells and p-type wells arranged alternately along the first direction with a well boundary between each of the n-type wells and the adjacent p-type well;

active regions over the n-type and the p-type wells and oriented lengthwise generally along a second direction perpendicular to the first direction;

an isolation structure over the n-type and the p-type wells and laterally between the active regions;

gate structures over the isolation structure and the active regions and oriented lengthwise generally along the first direction; and a first dielectric layer disposed at each of the well boundaries, wherein from a cross-sectional view, the first dielectric layer extends vertically through the gate structures and the isolation structure and into the n-type and the p-type wells, and from a top view, the first dielectric layer extends generally along the second direction and through all of the gate structures in the first and the second WPU areas.

2. The semiconductor device of claim 1, wherein the active regions in the first WPU area are arranged in a first row and a second row along the first direction, the active regions in the first row are aligned with the active regions in the second row, and two or more of the gate structures are arranged between the first and the second rows.

3. The semiconductor device of claim 2, wherein, in the first WPU area, the memory macro further includes:

first contact features disposed over each of the p-type wells and between the active regions in the first row; and second contact features disposed over each of the n-type wells and between the active regions in the second row.

4. The semiconductor device of claim 3, wherein the number of the first contact features disposed over each of the p-type wells is in a range from 2 to 10, and the number of the second contact features disposed over each of the n-type wells is in a range from 2 to 10.

5. The semiconductor device of claim 1, wherein the first dielectric layer includes a nitride.

6. The semiconductor device of claim 1, wherein the memory macro further includes a strap area, wherein the memory bit areas are arranged between the strap area and each of the first and the second WPU areas, wherein the n-type and the p-type wells also extend across the strap area, and the first dielectric layer is also disposed at each of the well boundaries in the strap area and extends across the strap area.

7. The semiconductor device of claim 6, wherein, in the strap area, the memory macro includes at least two rows of first contact features disposed over the p-type wells and at least two rows of second contact features disposed over the n-type wells, and wherein the first and the second contact features are disposed on different rows.

8. The semiconductor device of claim 1, wherein the memory macro includes at least two active regions over each of the n-type wells and at least four active regions over each of the p-type wells.

9. The semiconductor device of claim 1, wherein the active regions include fin active regions and the gate structures include high-k metal gates.

10. The semiconductor device of claim 1, wherein the first dielectric layer extends fully across the first and the second WPU areas.

11. A semiconductor device, comprising:

a memory macro, wherein the memory macro includes:

a first well pick-up (WPU) area along a first edge of the memory macro;

a second WPU area along a second edge of the memory macro opposite the first edge;

a strap area in a middle portion of the memory macro, wherein the first and the second WPU areas and the strap area are oriented lengthwise generally along a first direction; and memory bit areas arranged between the strap area and each of the first and the second WPU areas, wherein, in the first WPU area, the memory macro includes:

n-type wells and p-type wells arranged alternately one after another along the first direction with a well boundary between each pair of adjacent n-type well and p-type well;

active regions over the n-type and the p-type wells and oriented lengthwise generally along a second direction perpendicular to the first direction;

an isolation structure over the n-type and the p-type wells and laterally between the active regions;

gate structures over the isolation structure and the active regions and oriented lengthwise generally along the first direction; and a first dielectric layer, wherein from a cross-sectional view, the first dielectric layer extends vertically through the gate structures and the isolation structure and into the n-type and the p-type wells, wherein from a top view, the first dielectric layer extends generally along each of the well boundaries and fully across the first WPU area.

12. The semiconductor device of claim 11, wherein the n-type and the p-type wells also extend into the second WPU area, and the first dielectric layer is also disposed at each of the well boundaries in the second WPU area and extends fully across the second WPU area.

13. The semiconductor device of claim 11, wherein the n-type and the p-type wells also extend into the strap area, and the first dielectric layer is also disposed at each of the well boundaries in the strap area and extends fully across the strap area.

14. The semiconductor device of claim 11, wherein the n-type and the p-type wells also extend into the memory bit areas, and a portion of the first dielectric layer is disposed along a well boundary in the memory bit areas.

15. The semiconductor device of claim 11, wherein, in the first WPU area, the memory macro further includes:

first contact features disposed over the p-type wells; and second contact features disposed over the n-type wells, wherein the first and the second contact features are disposed on different rows along the first direction.

16. The semiconductor device of claim 15, wherein the number of the first contact features over each of the p-type wells is in a range from 2 to 10, and the number of the second contact features over each of the n-type wells is in a range from 2 to 10.

17. A layout of a memory macro, comprising:

a first well pick-up (WPU) area and a second WPU area, wherein the first and the second WPU areas are oriented lengthwise generally along a first direction; and memory bit areas arranged between the first and the second WPU areas, wherein, in the first WPU area, the layout includes:

n-type wells and p-type wells arranged alternately one after another along the first direction with a well boundary between each pair of adjacent n-type well and p-type well;

active regions over the n-type and the p-type wells and oriented lengthwise generally along a second direction perpendicular to the first direction;

gate structures over the active regions and oriented lengthwise generally along the first direction from a top view; and from the top view, first dielectric features extending lengthwise generally along the second direction and along each of the well boundaries and fully across the first WPU area, the first dielectric features separating the gate structures by extending from one side to another side of each of the gate structures.

18. The layout of claim 17, wherein, in the first WPU area, the layout further includes:
    at least two rows of first contact features disposed over the p-type wells; and
    at least two rows of second contact features disposed over the n-type wells, wherein the first and the second contact features are disposed on different rows along the first direction.

19. The layout of claim 17, further comprising:
    a strap area in a middle portion of the memory macro, wherein the memory bit areas are arranged between the strap area and each of the first and the second WPU areas, wherein the n-type and the p-type wells and the well boundaries also extend across the strap area, and wherein, in the strap area, the layout further includes:
    second active regions over the n-type and the p-type wells and oriented lengthwise generally along the second direction;
    second gate structures over the second active regions and oriented lengthwise generally along the first direction; and
    second dielectric features extending generally along the second direction and along each of the well boundaries and fully across the strap area, the second dielectric features separating the second gate structures.

20. The layout of claim 19, wherein, in the strap area, the layout further includes:
    at least two rows of first contact features disposed over the p-type wells; and
    at least two rows of second contact features disposed over the n-type wells, wherein the first and the second contact features are disposed on different rows along the first direction.

* * * * *